United States Patent [19]

Nourrcier, Jr. et al.

[11] Patent Number: 5,696,657

[45] Date of Patent: Dec. 9, 1997

[54] TEMPERATURE COMPENSATED APD DETECTOR BIAS AND TRANSIMPEDANCE AMPLIFIER CIRCUITRY FOR LASER RANGE FINDERS

[75] Inventors: Charles E. Nourrcier, Jr., Lakewood; Robert A. Kuehn, El Segundo, both of Calif.

[73] Assignee: Hughes Electronics, Los Angeles, Calif.

[21] Appl. No.: 460,483

[22] Filed: Jun. 2, 1995

[51] Int. Cl.[6] ............................................. H02H 7/00
[52] U.S. Cl. .............................. 361/93; 361/52; 361/115
[58] Field of Search ........................... 361/93, 115, 103, 361/100, 18, 52; 327/514, 535; 356/5.09

[56] References Cited

U.S. PATENT DOCUMENTS

| | | | |
|---|---|---|---|
| 4,001,614 | 1/1977 | Dahlinger | 307/311 |
| 4,415,803 | 11/1983 | Muoi | 250/214 A |
| 4,464,048 | 8/1984 | Farlow | 356/5 |
| 4,518,255 | 5/1985 | Zuleeg | 356/5 |
| 4,882,482 | 11/1989 | Smith et al. | 250/214 A |

*Primary Examiner*—Jeffrey A. Gaffin
*Assistant Examiner*—Stephen W. Jackson
*Attorney, Agent, or Firm*—Gordon R. Lindeen, III; Michael W. Sales; Wanda K. Denson-Low

[57] ABSTRACT

Laser range finder circuitry including an avalanche photodiode detector, a capacitor for storing a detector bias voltage, and a transimpedance amplifier for amplifying the detector signal. The capacitor is charged in response to a first control signal by a circuit employing first and second field effect transistors and is discharged in response to a second control signal by a circuit employing a third field effect transistor. An overload protection circuit including a single diode is provided to accommodate excessive charge created by backscatter upon initial laser firing. A temperature sensor is further provided to develop a temperature signal which may be monitored to adjust the detector bias voltage and other parameters so as to permit use of an associated laser range finder over a wide range of temperatures.

39 Claims, 1 Drawing Sheet

5,696,657

TEMPERATURE COMPENSATED APD DETECTOR BIAS AND TRANSIMPEDANCE AMPLIFIER CIRCUITRY FOR LASER RANGE FINDERS

BACKGROUND OF THE INVENTION

1. Field of the Invention

The subject invention relates to laser range finder circuitry and, more particularly, to improved detector bias and transimpedance amplifier circuitry useful with APD laser range finder receivers.

2. Description of Related Art

Present laser range finder receivers rely on photodiodes for detection of returns. There are two major categories of receiver photodiodes for the acceptor intrinsic donor ("PIN") diode, and the avalanche photodiode ("APD"). Either type of device can be based on indium gallium arsenide ("InGaAs") or germanium technology. The PIN diode is the most commonly but requires a signal of 60 nanowatts to 100 nanowatts for a 99% of detection. Uncooled APD receivers currently in use are capable of 99% detection with a signal of about 10 nanowatts. Because the greater sensitivity of the APD detectors translates into a greater maximum system range, are preferred for fabrication of a universal device applicable to a family of eye-safe laser range finders.

Current APD receivers rely on a bias network that instantaneously steps the bias down by some number of volts. This instantaneous step causes the transimpedance amplifier ("TIA"), which amplifies the detector signal, to The recovery from this effect can take as long as a microsecond. The saturation condition is due to current flowing through the parasitic capacitor the detector (approximately 1 pF) during the step voltage transition. Under these conditions a diode must be used in the TIA circuit in order to the input of the TIA. This diode adds parasitic capacitance on the order of 0.8 pF, which reduces circuit sensitivity and significantly the cost of the detector/preamplifier (TIA).

APD receivers are optimized at room temperature and, therefore, are suboptimal at other operating temperatures. System sensitivity over thus cannot be guaranteed. A number of components are also required for testing the frequency response of present APD amplifiers.

OBJECTS AND SUMMARY OF THE INVENTION

It is an object of the invention to improve laser systems;

It is object to improve laser range finder circuitry;

It is object of the invention to improve detector bias and transimpedance circuitry applicable to laser range finders;

It is another object to increase sensitivity of laser range finder systems; and

It another object to significantly improve sensitivity of laser range finder systems over temperature ranges such as −40° to +85° C. while decreasing cost.

According to the APD biasing concept of the invention, simple current sources used to charge and discharge the APD bias voltage. The discharge rate slow enough that an insignificant amount of current flows through the capacitance across the APD. The transimpedance amplifier or remains within its small signal dynamic range, allowing for very fast after the charging current source is disabled. Additionally, the clamp diode can be eliminated, resulting in a significant improvement in the sensitivity of system. The number of components within the detector/preamplifier can also be reduced.

According to another aspect of the invention, the addition of an on-substrate sensor allows the system to operate at peak sensitivity over all conditions. According to another aspect of the invention, the frequency response of the system is measured by illuminating the APD detector with an unmodulated CW source and examining the noise spectrum at the output of the TIA. The noise spectrum will have a power envelope versus frequency that is characteristic of the detector/preamplifier (TIA) frequency response. Additional parasitic capacitance and all of the components required to test frequency response in the prior art are eliminated. Thus, the net effect of the invention is cost and significantly higher yield due to increased margin on as well as optimal system performance over operating temperature extremes.

DESCRIPTION OF THE DRAWING

The objects and features of the present invention, which are believed to be are set forth with particularity in the appended claims. The present both as to its organization and manner of operation, together with objects and advantages, may best be understood by reference to the following description, taken in connection with the accompanying drawing.

DETAILED DESCRIPTION OF THE PREFERRED EMBODIMENTS

Figure 1:
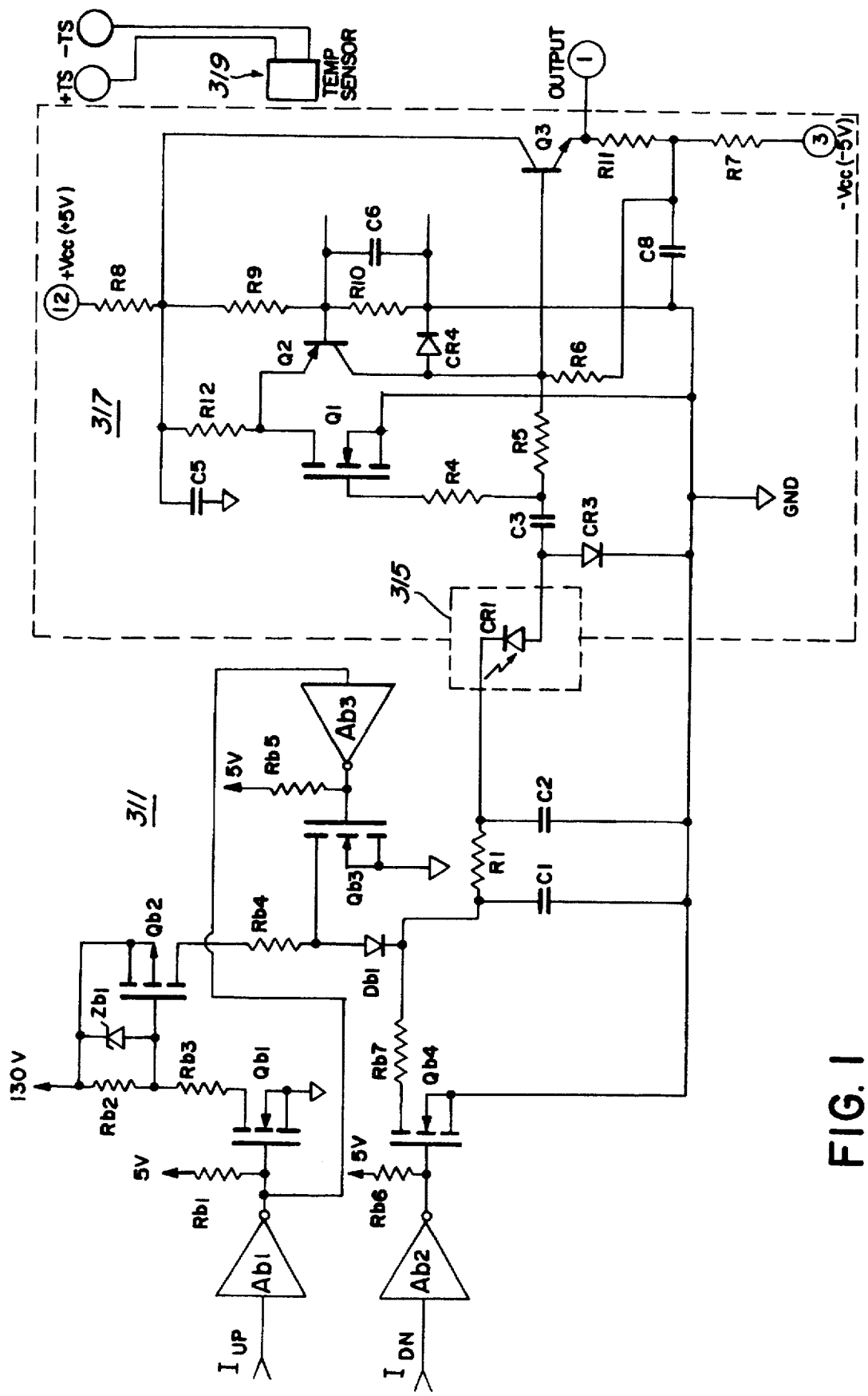
FIG. 1 is an electrical circuit diagram of an APD bias circuit and transimpedance according to the preferred embodiment.

The following description is provided to enable any person skilled in the art to make and use the invention and sets forth the best modes contemplated by the inventors of carrying out their invention. Various modifications, however, will remain readily apparent to those skilled in the art, since the generic principles of the present invention have been defined herein specifically to provide circuitry optimized for performance and ease of manufacture.

As shown in FIG. 1, the preferred embodiment of the invention includes an APD bias circuit 311, an APD detector 315, and a transimpedance amplifier circuit 317. While the detector 315 is preferably an APD device, other detector devices, such as PINs, can be used in various embodiments according to the invention.

With to the APD bias circuit 311, $I_{UP}$, and $I_{DN}$ signals are applied to the inputs respective inverter amplifiers $A_{b1}$, $A_{b2}$, for example, by a system (not shown). The output of the inverter $A_{b1}$ is applied to the gate of a bias circuit field effect transistor (FET) $Q_{b1}$ and to the input of a second amplifier $A_{b3}$. The gate of the first bias circuit FET $Q_{b1}$ is connected a resistor $R_{b1}$ to a reference voltage (+5 volts). The source of the $Q_{b1}$ is connected to ground, while its drain is connected to a first terminal a resistor $R_{b3}$. The second terminal of the resistor $R_{b3}$ is connected to a first of a resistor $R_{b2}$ and to the gate of a second bias circuit FET $Q_{b2}$. second terminal of the resistor $R_{b2}$ and the source of the second bias circuit $Q_{b2}$ are connected in common to a 130-volt dc supply voltage. A zener $Z_{b1}$ is connected in parallel with the resistor $R_{b2}$.

The drain of the second bias circuit FET $Q_{b2}$ is connected to a first terminal of a $R_{b4}$ whose second terminal is connected to the anode of a diode $D_{b1}$, and to the drain of a third bias circuit FET $Q_{b3}$. The source of the third bias circuit FET $Q_{b3}$ is connected to ground, while its gate is connected to one of a resistor $R_{b5}$ and to the output of the inverter amplifier $A_{b3}$. second terminal of the resistor $R_{b5}$ is connected to a 5-volt dc reference voltage.

3

The of the diode $D_{b1}$ is connected to a first terminal of a bias voltage capacitor C1 and to the drain of a fourth bias circuit FET $Q_{b4}$, whose is grounded. The gate of the fourth bias circuit FET $Q_{b4}$ is connected to the of the inverter amplifier $A_{b2}$ and to one terminal of a resistor $R_{b6}$ whose second terminal is connected to the 5-volt dc reference voltage.

The bias voltage storage capacitor C1 has its first terminal further connected to one terminal of a resistor R1 whose second terminal is connected to a shunt C2 and to the cathode of the APD detector diode CR1. The second of the capacitor C2 is grounded. The anode of the APD diode CR1 is to the anode of a PN diode CR3 whose cathode is further to ground. An AC coupling capacitor C3 connects the anode of the APD detector diode CR1 to the input of the transimpedance amplifier 317.

The to the transimpedance amplifier 317 comprises a node constituting the intersection of the first terminals of respective resistors R4 and R5. The second of the resistor R4 is connected to the gate of a first FET Q1, whose is connected to ground and whose drain is connected to the first terminal a resistor R12 and the emitter of an NPN transistor Q2. The second of the resistor R12 is connected to one terminal of a capacitor C5 opposite terminal is grounded, as well as to the collector of a PNP Q3.

The collector of the second transistor Q2 is connected to the anode of a PN diode and to the junction point of the second terminal of the resistor R5 and the first terminal of a resistor R6. The cathode of the PN diode CR4 is connected one terminal of a capacitor C6 whose second terminal is connected to the of the transistor Q2. The base of the transistor Q2 is further connected a resistor R9 to the second terminal of the resistor R12 and to a resistor R8 whose second terminal is connected to the 5-volt dc reference voltage.

The base of the third transistor Q3 is connected to the second terminal of the resistor R5, which thus constitutes a feedback resistor from the output to the of the amplifier 317. The emitter of the third transistor Q3 constitutes the of the transimpedance amplifier circuit 317 and is further connected to the terminal of a resistor R11. The second terminal of the resistor R11 is to the first terminal of a resistor R7, whose second terminal is to a –5-volt dc reference voltage. The first terminal of the resistor R7 further connected to a first terminal of a capacitor C8 and to the second terminal of the resistor R6. The second terminal of the capacitor C8 is grounded Examples of typical components for circuitry constructed according to embodiment are as follows:

TABLE

| Resistances K(Ω) | Other Components |
| --- | --- |
| $R_{b1}$ - 2 | C1 - 22 nF |
| $Rb_2$ - 4.7 | C2 - 10 pF |
| $Rb_3$ - 100 | C3 - 15 pF |
| $Rb_4$ - 200 | C5 - .01 µF |
| $Rb_5$ - 2 | C6 - 10 nF |
| $Rb_6$ - 2 | C8 - .01 µF |
| $Rb_7$ - 200 | CR3 - HP 5082 |
| R1 - 3.3 | CR4 - HP 5082 |
| R4 - .02 | Q1 - NEC71000MVC |
| R5 - 51 | Q2 - 2N4957 |
| R6 - 1 | Q3 - 2N2857 |
| R7 - .01 | |
| R8 - .01 | |
| R9 - 1.27 | |
| R10 - 1 | |
| R11 - 2.3 | |
| R12 - .160 | |

The foregoing values are illustrative only and may be varied in various embodiments for optimal performance in various laser range finder systems.

4

In operation of the circuit of FIG. 1, $I_{UP}$ and $I_{DN}$ control signals are selectively for example, by a microcontroller. The control signal $I_{UP}$ turns on FET $Q_{b2}$ by turning off FET $Q_{b1}$, causing the gate of the FET $Q_{b2}$ to float up in voltage. The increase in voltage permits current to flow from the 130-volt source through the resistor $R_{b4}$ and the diode $D_{b1}$, causing the voltage on the bias storage capacitor C1 to increase until such time as the $I_{UP}$ control signal turned off. The open collector type of logic gate is particularly designed to drive FETs such as FET $Q_{b1}$.

When the $I_{UP}$ control signal is off, the FET $Q_{b3}$ turns on, shorting the resistor $R_{b4}$ to ground so as to drain off leakage current from FET $Q_{b2}$ in order to prevent such current from further charging the capacitor C1. While $I_{UP}$ is off, the diode $D_{b1}$ serves to maintain the bias voltage held by the capacitor C1; i.e., prevents discharge of the capacitor voltage by current flow through the FET $Q_{b3}$. The bias voltage held by the capacitor C1 may range from 30 volts to 90 volts and is determined by the length of time $I_{UP}$ is "on" and the breakdown of the APD 315.

Application of the $I_{DN}$ control signal turns on the FET $Q_{b4}$ and discharges the bias storage capacitor C1 to ground through the resistor $R_{b7}$. Both $I_{UP}$ and $I_{DN}$ are off when the circuitry is inactive.

Once the bias voltage storage capacitor C1 has been charged, the detector circuit 315 is biased for operation, for example, to detect a laser pulse return after firing a laser. When the laser is initially fired, a large amount of energy is or "back-scattered" back into the laser range finder optics, causing TIA amplifier 317 to saturate. Accordingly, the diode CR3 is employed in circuit to become forward biased by the increase in detector voltage and to the charge to ground; i.e., the diode CR3 comprises protection circuitry for accommodating initial overloads. The circuit provided by the capacitor and the resistor R1 connected to the APD 315 limits the amount of energy which can be dumped through the diode CR3. After the diode CR3 stops the voltage on the capacitor C2 rapidly increases, via charging flow through the capacitor C1 and the resistor R1.

The capacitor C3 is an AC coupling capacitor, which connects the detector circuit the TIA 317. The TIA 317 itself may be viewed as a typical operational having a feedback resistor R5 connected between its output and input which, in an illustrative embodiment, has a value of 51 K Ω.

In preferred TIA amplifier 317 shown in FIG. 1, the current flowing into R4-R5-C3 node is multiplied by the value of the feedback resistor R5, an output voltage at the emitter of the third transistor Q3. The FET 1 has a "gm" parameter associated with it, which is basically a voltage-to-current converting factor. As current flows through the coupling capacitor C3, the gate voltage on the FET Q1 rises, causing more current flow through the FET Q1. The transistor Q2 tries to hold the drain of the FET Q1 at a constant voltage. Thus, as the FET Q1 "asks" for more current, the transistor Q2 turns off. As the transistor Q2 shuts off, in order to hold steady state, its collector voltage moves down, producing a voltage across the feedback resistor R5. For the selected value of R5 of 51 KΩ, this voltage ultimately equals 51 KΩ times current flowing through the AC coupling capacitor C3. The transistor Q3 is a buffer-follower whose emitter voltage side is 0.7 below the voltage on its (i.e., the voltage developed across the feedback resistor R5).

The TIA amplifier resistor R6 can be used to achieve a manufacturing advantage according to the preferred embodiment. The stability of the amplifier is a function of the open loop gain, which is determined by the "gm" of the FET Q1 and the value of the resistor R6. Thus, if gm changes, the value of R6 may be adjusted to compensate for it. Thus, in production, an entire wafer of FETs Q1 may be fabricated. After R6 is adjusted to get proper compensation for one of the FETs Q1 from the wafer, all devices on that wafer can be used with the same R6 value.

As to the remainder of the components, resistors R9 and R10 bias the transistor Q2 and set its operating point. The capacitor C6 makes the node an AC short circuit. The diode CR4 prevents circuit overload. The resistors R7 and R11 are respectively used for power supply isolation and to bias the second transitor Q3.

The feedback resistor R5 determines the amount of transimpedance gain i.e., current-to-voltage transfer. Whatever current goes through C3×51K equals the output voltage swing. The feedback resistor R5 further determines the ultimate bandwidth of the system. Lowering the value of R5 provides bandwidth, enabling the system to operate with shorter laser pulses.

The detector 315 and TIA amplifier 317 are preferably formed as a hybrid circuit on a common substrate such as alumina. A temperature sensor 319 is mounted on the substrate next to the detector 315 and enables optimizing the receiver as a function of temperature. Thus, an associated microcontroller may continuously and recalibrate the receiver as a function of temperature. The temperature sensor 319 may be a commercially available AD590 sensor wherein a reference voltage is applied to a first terminal +TS, producing a current at a second terminal -TS which is related to temperature. This current is converted to a voltage which enables an associated microcontroller to read the temperature of the detector 315.

The frequency response of the system of FIG. 1 is measured by illuminating the detector 315 with an unmodulated CW source and looking at the noise spectrum at the output TIA OUT of the amplifier 317. The noise spectrum will have a power envelope versus frequency that is characteristic of the detector/preamplifier frequency response. The frequency response of the amplifier will vary from part to part due to the "gm" parameter of the preferred NEC71000 GaAs FET. The feedback loop can compensate for this effect by adjusting the values of the resistors R5 and R6. This is an important cost savings because the select-in-test only occurs once for each lot-buy of the NEC71000 FET. Therefore the value of the resistor R6 is selected on the first unit and is fixed for the balance of the production run. The value of the resistor R5 is not normally changed because it affects the amount of output voltage.

Another feature of this design is the addition of the temperature sensor 319 within the detector/preamplifier package. The optimum detector bias voltage can shift dramatically with temperature changes. The temperature sensor 319 allows the system to monitor this condition and self-calibrate the receiver operating parameters, such as receiver offset voltages, false alarm rate, and APD bias voltage. Essentially, the receiver can be optimized for performance over the entire operating temperature range.

The receiver sensitivity is optimized by increasing the APD bias voltage (this increases the APD gain) until the APD noise is larger than the electronics noise. Once the APD noise begins to dominate the electronics noise of the preamplifies 317, further increases in APD gain will reduce the system NEP (noise equivalent power). At low temperatures, the APD gain must be high in order to overcome the preamplifier noise. This is due to low leakage currents within the APD at low temperatures. Under these conditions, the APD noise may not be larger than the preamplifier noise because of limitations in achievable APD gain. All of these effects can be optimized by monitoring the APD temperature along with self-calibrating electronics.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. The apparatus comprising:
   a photodiode detector means for producing an output signal in response to illumination thereof;
   means responsive to a charging current for developing and storing a bias voltage and applying said bias voltage to said detector; and
   current supply means responsive to a first control signal for supplying said charging current to said means for developing and storing a bias voltage, said current supply means further comprising:
   a first field effect transistor means responsive to a first signal at a gate thereof for causing current to flow to said means for developing and storing a bias voltage; and
   a second field effect transistor means responsive to said first control signal for causing said first signal to be applied to said gate.

2. The apparatus of claim 1 further comprising current discharge means responsive to a second control signal for discharging said bias voltage.

3. The apparatus of claim 1 wherein said photodiode detector means includes an avalanche photodiode.

4. The apparatus of claim 1 further including temperature sensor means mounted for monitoring the temperature in the vicinity of said photodiode detector means and providing a signal indicative of said temperature.

5. The apparatus of claim 4 wherein said temperature sensor means and said photodetector means are mounted on a common substrate.

6. The apparatus of claim 1 further including transimpedance amplifier (TIA) means for amplifying the output signal provided by said detector and having an input connected to said detector and an output.

7. The apparatus of claim 6 wherein said detector supplies a current to said input of said TIA means and wherein said TIA means further applies a current-voltage transfer factor to said current so as to produce a voltage at its output which is a multiple of said current.

8. The apparatus of claim 7 wherein said transimpedance amplifier means includes a field effect transistor and a first resistance and has an open loop gain determined by a parameter "gm" of said field effect transistor and by the value of said first resistance; and wherein the value of said first resistance is adjusted to compensate for variations in the parameter "gm" in order to a desired open loop gain.

9. The apparatus of claim 7 wherein said transimpedance amplifier means includes a feedback resistance whose value is said multiple.

10. The apparatus of claim 9 wherein said feedback resistance is adjustable to the bandwidth of said apparatus.

11. The apparatus of claim 1 further including overload protection circuit for dumping to ground excess charge applied to said photodiode detector means.

12. The apparatus of claim 11 wherein said excess charge is generated in response to backscatter generated upon firing of an associated laser.

13. The apparatus of claim 11 wherein said overload protection circuit means a diode connected to said photodiode detector means and to ground.

14. The apparatus of claim 13 wherein said overload protection circuit means further includes a resistor-capacitor network means for limiting the amount of energy which can be dumped through said diode.

15. The apparatus of claim 1 further comprising a third field effect transistor means responsive to turning off of said first control signal for inhibiting discharge of said bias voltage.

16. The apparatus of claim 15 further including fourth field effect transistor means responsive to a second control signal for discharging said bias voltage.

17. The apparatus of claim 16 further including-overload protection circuit means for dumping to ground excess charge generated by said photodiode detector.

18. The apparatus of claim 17 wherein said excess charge is generated in response to backscatter generated upon firing of an associated laser.

19. The apparatus of claim 17 wherein said overload protection circuit means comprises a diode connected to said photodiode detector means and to ground.

20. The apparatus of claim 19 wherein said overload protection circuit means further includes a resistor-capacitor network means for limiting the amount of energy which can be dumped through said diode.

21. Laser finder apparatus comprising:

a photodiode detector having a first terminal and a second output terminal;

a charge storage device connected to the first terminal of said photodiode detector for a detector bias voltage;

a current source connected to said charge storage device and responsive to a first control signal to apply a charging current to said charge storage device, said current source including a first field effect transistor having a first terminal connected to a voltage source, said first field effect transistor being switchable to cause supply of said charging current to said charge storage device; and a circuit including a transistor switch connected to said charge storage device and responsive to a second control signal to discharge said charge storage device.

22. The laser range finder apparatus of claim 21 wherein said photodiode detector comprises an avalanche photodiode.

23. The laser range finder apparatus of claim 21 further including a temperature sensing means mounted in the vicinity of said photodiode detector for monitoring the temperature in said vicinity and providing a signal of temperature.

24. The laser range finder apparatus of claim 21 wherein said current source further includes a second field effect transistor having a gate terminal connected to receive said first control signal and a first terminal connected through a resistance to the gate of said first field effect transistor.

25. The laser range finder apparatus of claim 24 further including a third field effect transistor having a gate, an inverter having an output connected to said gate and having an input connected to receive said first control signal, said third field effect transistor further having a first terminal connected to the annode of a diode and a second terminal connected to ground, said diode further having a cathode connected to said charge storage device.

26. The laser range finder apparatus of claim 21 further including an overload protection circuit means for dumping to ground excess charge generated by said photodiode detector.

27. The laser range finder apparatus of claim 26 wherein said overload protection circuit comprises a diode connected to said photodiode detector and to ground.

28. The laser range finder apparatus of claim 27 wherein said overload protection circuit means further includes a resistor-capacitor network having a connection to said photodiode detector for limiting the amount of excess charge which can be dumped through said diode.

29. The laser range finder apparatus of claim 21 further including a transimpedance amplifier having an input connected to said second output terminal and an output.

30. The laser range finder apparatus of claim 29 wherein said transimpedance amplifier applies a current-to-voltage transfer factor to a current at its input so as to produce a voltage at its output which is a multiple of said current.

31. The laser range finder apparatus of claim 30 wherein said transimpedance amplifier includes a field effect transistor and a first resistance and has an open loop gain determined by a parameter "gm" of said field effect transistor and by the value of said first resistance; and wherein the value of said first resistance is adjusted to compensate for variations in the parameter "gm" in order to maintain a desired open loop gain.

32. The laser range finder apparatus of claim 30 wherein said transimpedance amplifier further includes a feedback resistance whose value is said multiple.

33. The laser range finder apparatus of claim 32 wherein said feedback resistance adjustable to increase the bandwidth of said apparatus.

34. The apparatus comprising:

a photodiode detector means for producing an output signal in response to illumination thereof;

means responsive to a charging current for developing and storing a bias voltage and applying said bias voltage to said detector;

current supply means responsive to a first control signal for supplying said charging current to said means for developing and storing a bias voltage; and temperature sensor means mounted for monitoring the temperature in the vicinity of said photodiode detector means and providing a signal indicative of said temperature.

35. The apparatus of claim 34 further comprising current discharge means responsive to a second control signal for discharging said bias voltage.

36. The apparatus of claim 34 wherein said temperature sensor means and said photodetector means are mounted on a common substrate.

37. The apparatus of claim 34 further including transimpedance amplifier (TIA) means for amplifying the output signal provided by said detector and having an input connected to said detector and an output.

38. The apparatus of claim 37 wherein said detector supplies a current to said input of said TIA means and wherein said TIA means further applies a current-voltage transfer factor to said current so as to produce a voltage at its output which is a multiple of said current.

39. Laser range finder apparatus comprising:

a photodiode detector having a first terminal and a second output terminal;

a charge storage device connected to the first terminal of said photodiode detector for storing a detector bias voltage;

a current source connected to said charge storage device and responsive to a first control signal to apply a charging current to said charge storage device;

a circuit including a transistor switch connected to said charge storage device and responsive to a second control signal to discharge said charge storage device; and a temperature sensing means mounted in the vicinity of said photodiode detector for monitoring the temperature in said vicinity and providing a signal indicative of temperature.

* * * * *